US007979218B2

(12) United States Patent
Suda

(10) Patent No.: US 7,979,218 B2
(45) Date of Patent: Jul. 12, 2011

(54) TEST APPARATUS, TEST METHOD AND COMPUTER READABLE MEDIUM

(75) Inventor: Masakatsu Suda, Tokyo (JP)

(73) Assignee: Advantest Corporation, Tokyo (JP)

( * ) Notice: Subject to any disclaimer, the term of this patent is extended or adjusted under 35 U.S.C. 154(b) by 541 days.

(21) Appl. No.: 12/108,524

(22) Filed: Apr. 24, 2008

(65) Prior Publication Data

US 2009/0287431 A1    Nov. 19, 2009

Related U.S. Application Data

(63) Continuation of application No. PCT/JP2006/320552, filed on Oct. 16, 2006.

(30) Foreign Application Priority Data

Oct. 27, 2005    (JP) .................................. 2005-313335

(51) Int. Cl.
*G01R 31/00*    (2006.01)
(52) U.S. Cl. ......................................... 702/58
(58) Field of Classification Search ...................... 702/58
See application file for complete search history.

(56) References Cited

U.S. PATENT DOCUMENTS

| 2006/0072273 | A1* | 4/2006 | Hashimoto | .................. | 361/93.1 |
| 2007/0091698 | A1* | 4/2007 | Watanabe et al. | ............. | 365/201 |

FOREIGN PATENT DOCUMENTS

| JP | 7-218596 | 8/1995 |
| JP | 9-236637 | 9/1997 |
| JP | 2001-4692 | 1/2001 |
| WO | 2004104606 | 12/2004 |

OTHER PUBLICATIONS

"Office Action of German Counterpart Application" issued on Mar. 12, 2010, p. 1-p. 10.

* cited by examiner

*Primary Examiner* — Aditya Bhat
(74) *Attorney, Agent, or Firm* — Jianq Chyun IP Office

(57) ABSTRACT

Provided is a test apparatus for testing a device under test, the test apparatus including: a pattern generating section that inputs a test pattern to the device under test; a judging section that judges whether the device under test is defective or not, based on an output signal outputted from the device under test; a power supply apparatus that supplies a source power to the device under test; and a setting section that detects a fluctuation amount of the source voltage resulting when the test pattern is inputted to the device under test, and sets, based on the detected fluctuation amount, a current range within which a compensation current that is in accordance with a fluctuation of a consumption current consumed by the device under test is generated at a predetermined number of levels so as to compensate a fluctuation of a source voltage to be applied to the device under test attributable to the fluctuation of the consumption current.

11 Claims, 14 Drawing Sheets

TEST APPARATUS, TEST METHOD AND COMPUTER READABLE MEDIUM

CROSS REFERENCE TO RELATED APPLICATION

This is a continuation application of PCT/JP2006/320552 filed on Oct. 16, 2006 which claims priority from a Japanese Patent Application No. 2005-313335 filed on Oct. 27, 2005, the contents of which are incorporated herein by reference.

BACKGROUND

1. Technical Field

The present invention relates to a test apparatus, a test method, and a computer readable medium for testing a device under test such as a semiconductor circuit. In particular, the present invention relates to a test apparatus, a test method, and a computer readable medium for compensating a fluctuation of a source power supplied to a device under test.

2. Related Art

In testing a device under test such as a semiconductor circuit, the source power is supplied for driving the device under test. For example, a power supply apparatus included in a test apparatus supplies a source power to a device under test via power supply wiring.

However, in a device under test such as a CMOS circuit, the consumption current fluctuates when the activity ratio varies among the elements included in the device under test. The voltage drop amount of the source voltage supplied to the circuit of the device under test fluctuates in accordance with the fluctuation of the consumption current attributable to the impedance of the power supply wiring connecting the power supply apparatus and the device under test, the impedance of the power supply wiring within the device under test, or the output impedance of the power supply apparatus.

When such a fluctuation occurs in a voltage drop amount of the source voltage, the device under test cannot be tested accurately. To counter such a problem, conventional test apparatuses have detected fluctuation of the source voltage and fed it back to a power supply apparatus, thereby generating a source voltage for compensating the fluctuation. Currently, no related patent document has been recognized, and so the description thereof is omitted.

However, because the above-described test apparatus feeds back the fluctuation of the source voltage to a power supply apparatus that generates a source voltage, the compensation cannot rapidly follow the fluctuation of source voltage, due to the size of the time constant of the resistance component, the capacitance component, or the like of the power supply wiring, the feedback path, and the like. For example, the speed of the feedback for the above-described test apparatus is several tens of kHz or slower.

As opposed to this, the fluctuation of the source voltage for a device under test that fluctuates according to a test pattern is some tens of MHz or above, and so the above-described test apparatus cannot follow the fluctuation of the source voltage that fluctuates in such a rapid manner.

SUMMARY

Therefore, it is an object of an aspect of the innovations herein to provide a test apparatus, a test method, and a computer readable medium which are capable of overcoming the above drawbacks accompanying the related art. The above and other objects can be achieved by combinations described in the independent claims. The dependent claims define further advantageous and exemplary combinations of the innovations herein.

According to an aspect related to the innovations herein, one exemplary test apparatus is a test apparatus for testing a device under test, the test apparatus including: a pattern generating section that inputs a test pattern to the device under test; a judging section that judges whether the device under test is defective or not, based on an output signal outputted from the device under test; a power supply apparatus that supplies a source power to the device under test; and a setting section that detects a fluctuation amount of the source voltage resulting when the test pattern is inputted to the device under test, and sets, based on the detected fluctuation amount, a current range within which a compensation current that is in accordance with a fluctuation of a consumption current consumed by the device under test is generated at a predetermined number of levels so as to compensate a fluctuation of a source voltage to be applied to the device under test attributable to the fluctuation of the consumption current.

According to an aspect related to the innovations herein, one exemplary test method is a test method for testing a device under test, the test method including: inputting a test pattern to the device under test; making judgment concerning pass/fail of the device under test, based on an output signal outputted from the device under test; supplying a source power to the device under test; generating, so as to compensate a fluctuation of a source voltage to be applied to the device under test attributable to a fluctuation of a consumption current consumed by the device under test, a compensation current that is in accordance with the fluctuation of the consumption current within a current range being set and at a predetermined number of levels; and detecting a fluctuation amount of the source voltage resulting when the test pattern is inputted to the device under test, and setting the current range based on the detected fluctuation amount.

According to an aspect related to the innovations herein, one exemplary computer readable medium is a computer readable medium storing a program, where upon execution of the program, a test apparatus for testing a device under test performs: inputting a test pattern to the device under test; making judgment concerning pass/fail of the device under test, based on an output signal outputted from the device under test; supplying a source power to the device under test; generating, so as to compensate a fluctuation of a source voltage to be applied to the device under test attributable to a fluctuation of a consumption current consumed by the device under test, a compensation current that is in accordance with the fluctuation of the consumption current within a current range being set and at a predetermined number of levels; and detecting a fluctuation amount of the source voltage resulting when the test pattern is inputted to the device under test, and setting the current range based on the detected fluctuation amount.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 3A shows source voltage fluctuation compensation in a conventional test apparatus, while FIG. 3B shows one example of a source voltage fluctuation compensation in a test apparatus 100 shown in FIG. 1.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
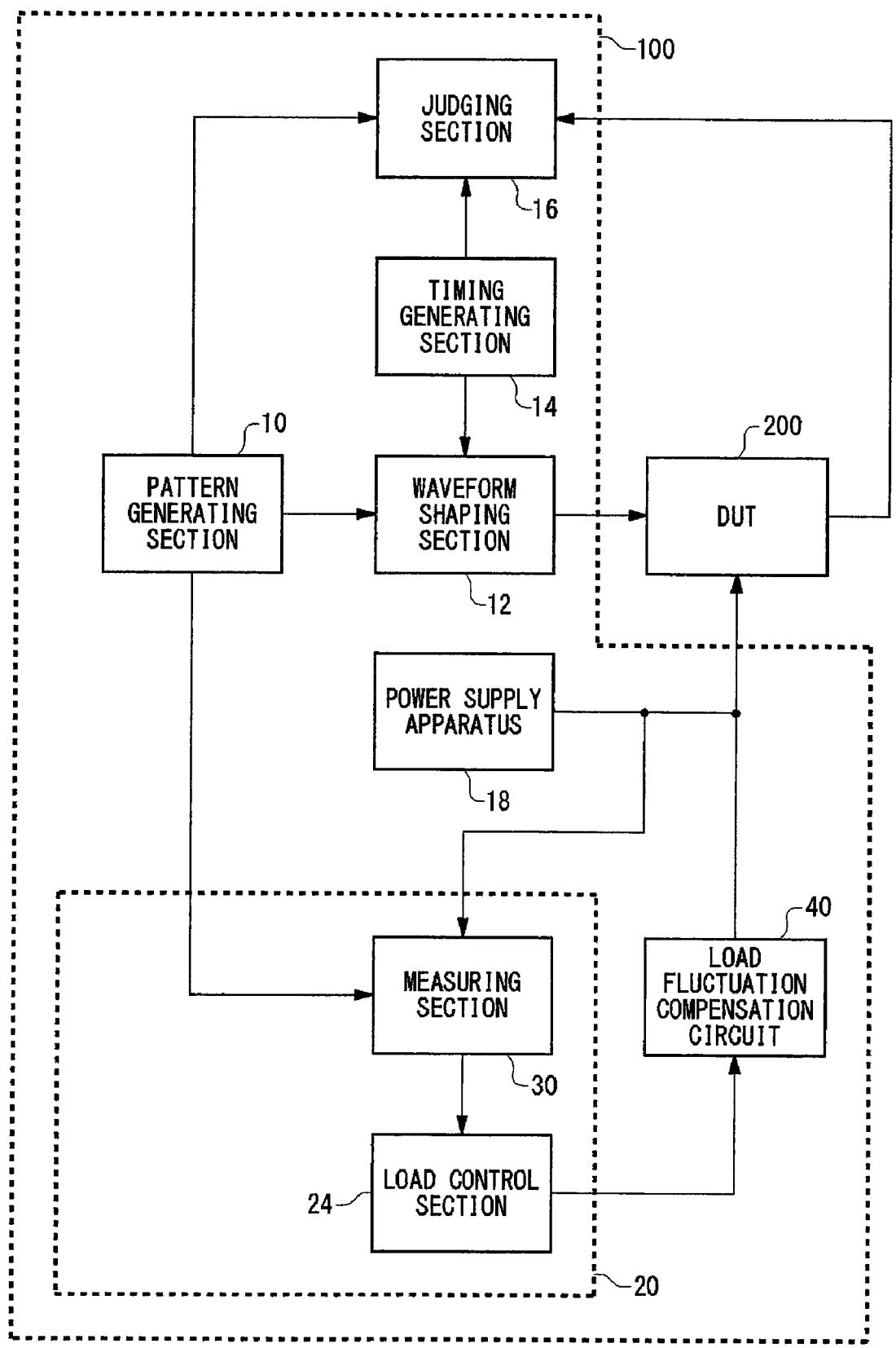
FIG. 1 shows one example of the configuration of a test apparatus 100 according to an embodiment of the present invention.

FIG. 1 shows one example of the configuration of a test apparatus 100 according to an embodiment of the present invention. The test apparatus 100 is an apparatus for testing a device under test 200 such as a semiconductor circuit, and includes a pattern generating section 10, a waveform shaping section 12, a timing generating section 14, a judging section 16, a power supply apparatus 18, a setting section 20, and a load fluctuation compensation circuit 40.

The pattern generating section 10 generates a test pattern for testing the device under test 200, and inputs the test pattern to the device under test 200 via the waveform shaping section 12. For example, the pattern generating section 10 sequentially generates a plurality of test patterns at the time of actual testing of the device under test 200, based on a test program given in advance by a user or the like. The test pattern is a pattern represented by digital data for example. The actual testing of the device under test 200 is for example a functional test for testing to see whether the function of the device under test 200 is normal, a real time test for testing the operational speed of the device under test 200, or the like, by comparing an expected value signal with a signal outputted by the device under test when a predetermined test pattern is inputted to the device under test.

The waveform shaping section 12 shapes a signal to be inputted to the device under test 200 based on the test pattern given by the pattern generating section 10. For example, the waveform shaping section 12 shapes a signal indicating a voltage value that is in accordance with the digital data of the test pattern, according to the timing clock given by the timing generating section 14.

The judging section 16 judges whether the device under test 200 is defective or not, based on the output signal outputted from the device under test 200. For example, the judging section 16 judges whether the device under test 200 is defective or not, by comparing an expected value signal given by the pattern generating section 10 with the output signal outputted from the device under test 200. The judging section 16 may perform the comparison according to the timing clock given by the timing generating section 14.

The power supply apparatus 18 supplies the source power for driving the device under test 200, to the device under test 200. The load fluctuation compensation circuit 40 compensates the fluctuation of the source voltage applied to the device under test 200 occurring due to the fluctuation of the consumption current of the device under test 200. For example, the load fluctuation compensation circuit 40 is provided as a branch from the power supply wiring connecting between the power supply apparatus 18 and the device under test 200, to draw in the compensation current from the power supply wiring. That is, as a result that the load fluctuation compensation circuit 40 consumes the compensation current that is in accordance with the fluctuation of the consumption current of the device under test 200, the source current transmitted through the power supply wiring is made substantially constant, thereby making the voltage drop of the source voltage in the power supply wiring to be substantially constant.

According to such a configuration, it is possible to compensate the fluctuation of the consumption current at the actual testing of the device under test 200, and to compensate the fluctuation of the source voltage applied to the device under test 200. The load fluctuation compensation circuit 40 may be desirably connected in the vicinity of the source power input terminal of the device under test 200, as a branch from the power supply wiring. By providing the load fluctuation compensation circuit 40 in the vicinity of the device under test 200, it becomes possible to rapidly follow the fluctuation of the source voltage.

The load fluctuation compensation circuit 40 generates a compensation current at a predetermined number of levels, to compensate the fluctuation of the source voltage supplied to the device under test 200. The number of levels is determined by the circuitry configuration of the load fluctuation compensation circuit 40 for example.

The fluctuation amount of the source voltage, however, is not constant due to an inputted test pattern, a device characteristic, etc. For this reason, depending on the fluctuation amount of the source voltage, there is a case where highly accurate compensation is not possible if the number of levels, the set resolution power, or the variable range of the compensation current generated by the load fluctuation compensation circuit 40 are constant. In contrast, the test apparatus 100 in the present example includes a setting section 20 that detects the fluctuation amount of the source voltage when a test pattern is inputted to a device under test, and sets the resolution power and the variable amount (current range) for the compensation current in the load fluctuation compensation circuit 40 based on the detected fluctuation amount.

The setting section 20 sets the current range and the resolution power for the current compensation for the load fluctuation compensation circuit 40. Here, since the number of levels of the current compensation for the load fluctuation compensation circuit 40 is constant, the setting section 20 may set both of the current range and the resolution power by determining either of the current range or the resolution power. In addition, the setting section 20 determines the current range and the resolution power based on the maximum value of the fluctuation of the source voltage supplied to the device under test 200. For example, by determining the fluctuation amount of the source voltage compensated when the compensation current of the maximum value in the current range is generated to be substantially the same as the maximum value of the fluctuation of the source voltage, the load fluctuation compensation circuit 40 to which a certain number of levels is set can generate a more accurate compensation current in compensating the fluctuation of the source voltage.

The setting section 20 includes a measuring section 30 and a load control section 24. The measuring section 30 measures the fluctuation amount of the source voltage applied to the device under test 200 when the test pattern is supplied to the device under test 200, as a deviation from a predetermined reference voltage. Here, the reference voltage may be voltage rating predetermined by a specification or the like, to be applied to the device under test 200, or may be a source voltage resulting when a test pattern to be generated prior to the test pattern in a test program is applied to the device under test 200.

The load control section 24 sets the current range and the resolution power for the load fluctuation compensation circuit 40, based on the fluctuation amount of the source voltage measured by the measuring section 30. The load control section 24 may determine the current range and the resolution power so that the fluctuation amount of the source voltage compensated when the compensation current of the maximum value within the current range is substantially the same as the maximum value of the fluctuation of the source voltage as mentioned above. According to such a configuration, the load fluctuation compensation circuit 40 to which a certain number of levels is set can generate a more accurate compensation current in compensating the source voltage.

Setting of the load fluctuation compensation circuit 40 described above may be performed prior to the actual testing of the device under test 200 for example. When a plurality of test patterns are inputted at the time of actual testing of the device under test 200, the pattern generating section 10 sequentially inputs the plurality of test patterns to the device under test at the time of setting the load fluctuation compensation circuit 40.

The measuring section 30 may detect the fluctuation amount of the source voltage applied to the device under test 200 for each test pattern. For example, the measuring section 30 may measure a source voltage waveform of the device under test 200 for each test pattern inputted to the device under test 200, and detect the fluctuation amount of the source voltage for each test pattern, by comparing the maximum value to the minimum value of the source voltage, based on each measured source voltage waveform. In addition, the load control section 24 may set the current range and the resolution power for the load fluctuation compensation circuit 40, based on the maximum value of the fluctuation amount of the detected source voltage. By setting in the above manner, it is possible to accurately compensate the fluctuation of the source voltage.

The pattern generating section 10 may input, to the device under test 200, a predetermined test pattern that maximizes the fluctuation amount of the source voltage for the device under test 200, prior to the actual testing of the device under test 200. For example, the test pattern may be set by calculating the consumption current determined by the activity ratio of the element group included in the device under test 200 when the test pattern is supplied to the device under test 200.

In this case, the measuring section 30 detects the fluctuation of the source voltage of the device under test 200 when the test pattern is inputted to the device under test 200. The load control section 24 sets the current range and the resolution power for the load fluctuation compensation circuit 40 prior to the actual testing of the device under test 200, based on the detected fluctuation amount.

In addition, setting of the load fluctuation compensation circuit 40 may be performed if the defective ratio of the device under test 200 is determined, by the judging section 16, to be higher than a predetermined reference value, after the actual testing of the device under test 200, for example. In this case, the pattern generating section 10 inputs, to the device under test 200, either the plurality of test patterns described above or a predetermined test pattern, for measuring the fluctuation of the source voltage of the device under test 200. Then the setting section 20 sets the current range and the resolution power for the load fluctuation compensation circuit 40 as described above. Then the test apparatus 100 performs the actual testing of the device under test 200 again. According to such control, it is possible to reduce the misjudgment concerning the pass/fail of the device under test 200, which is attributable to non-optimization of the setting of the load fluctuation compensation circuit 40.

A control unit for controlling the test apparatus 100 may perform the above-described operation of the pattern generating section 10 and the setting section 20 at the setting of the load fluctuation compensation circuit 40 and at the actual testing of the device under test 200.

Figure 2:
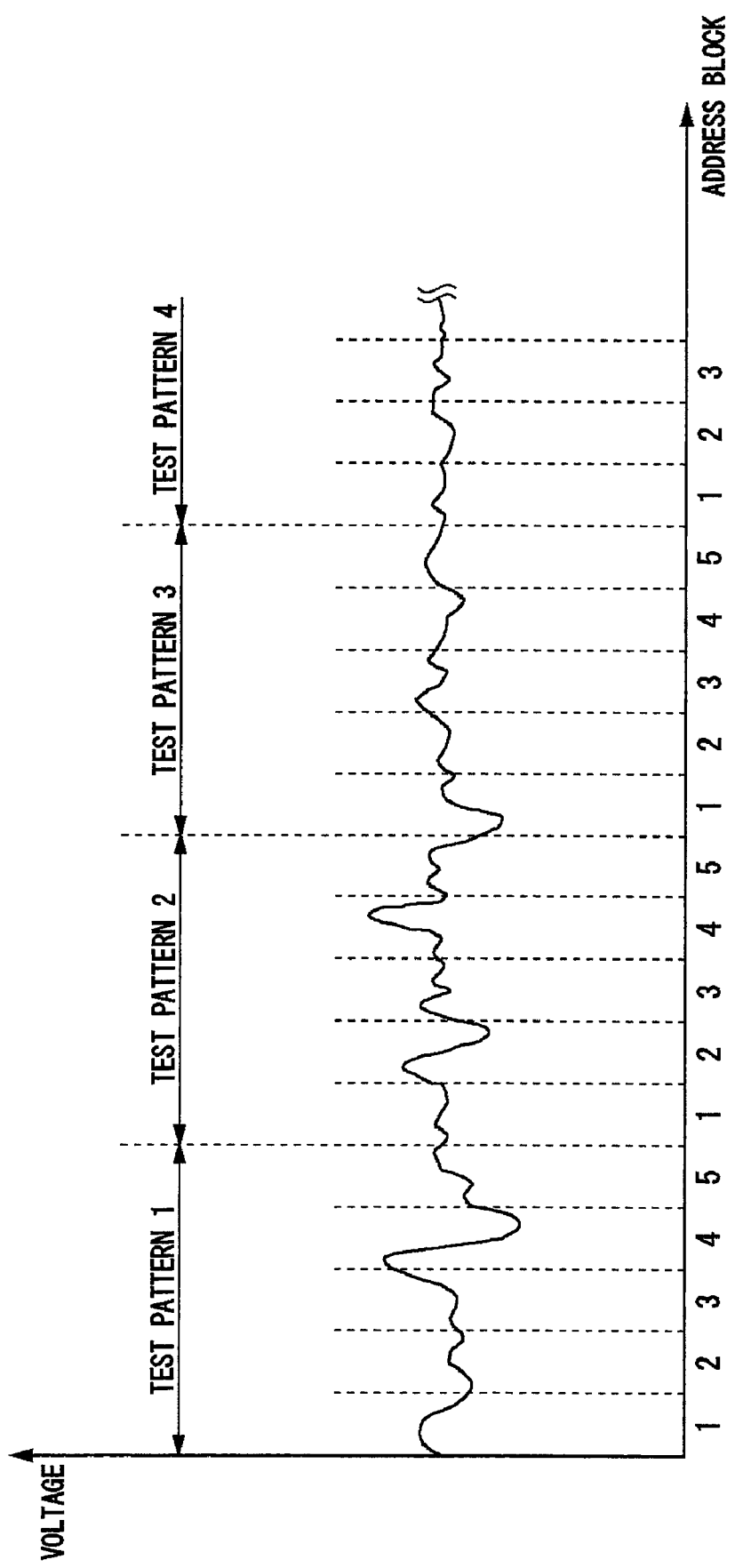
FIG. 2 shows one example of a source voltage waveform of a device under test 200.

FIG. 2 shows one example of a source voltage waveform of the device under test 200. In FIG. 2, the horizontal axis represents the address block of a test pattern applied to the device under test 200, and the vertical axis represents the voltage value of the source voltage.

The pattern generating section 10 sequentially generates a plurality of test patterns, and sequentially inputs the test patterns to the device under test 200. Each test pattern is divided into a plurality of address blocks. In the example of FIG. 2, each test pattern is divided into five address blocks.

As described above, the measuring section 30 may detect the fluctuation amount of the source voltage applied to the device under test 200, for each test pattern. In addition, the measuring section 30 may detect the fluctuation amount of the source voltage applied to the device under test 200 for each address block. A user may define in advance whether the measuring section 30 detects the fluctuation of the source voltage for each test pattern or for each address block.

Figure 3A:
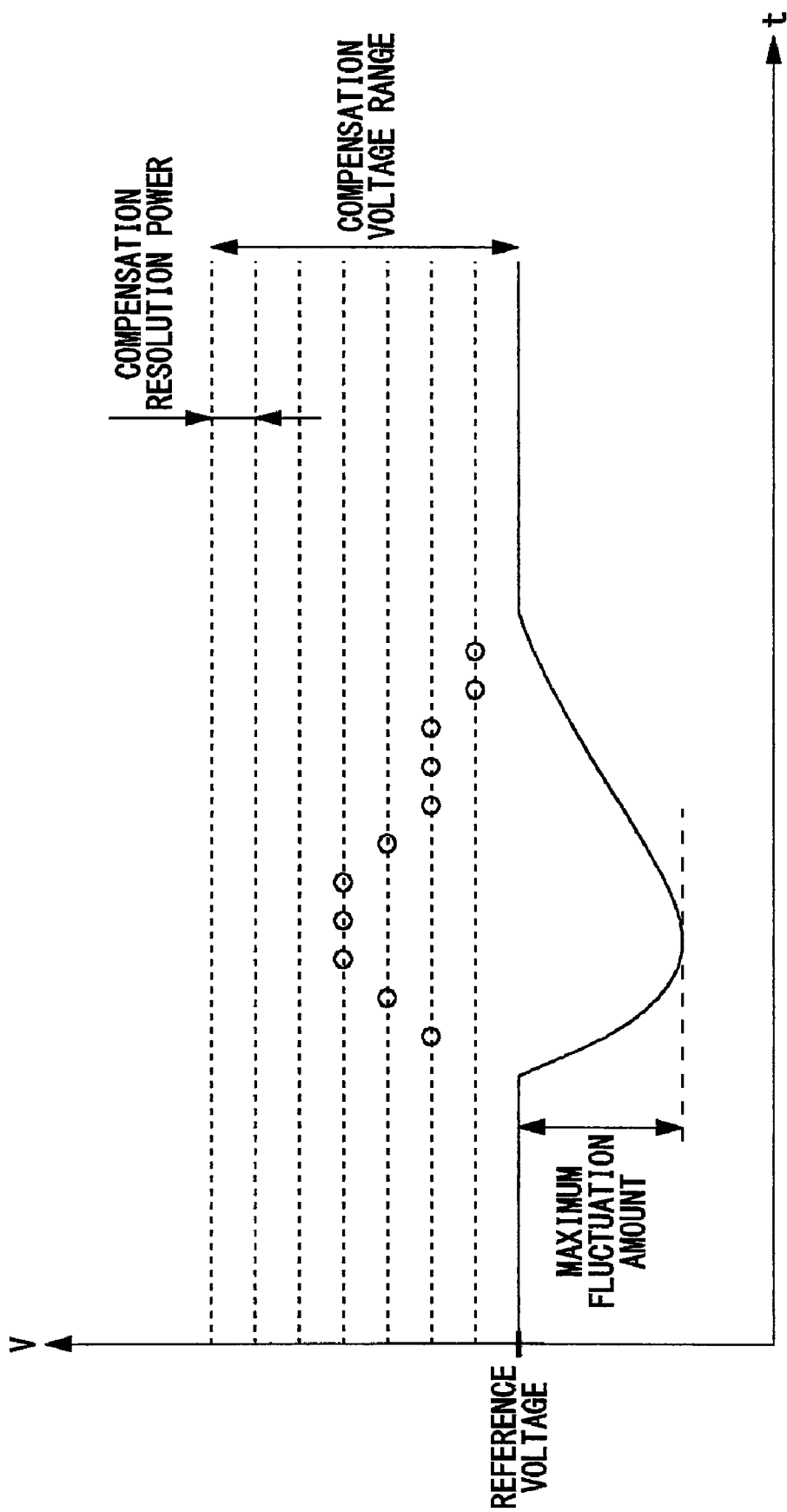
FIGS. 3A and 3B show an example of source voltage fluctuation compensation.
Figure 3B:
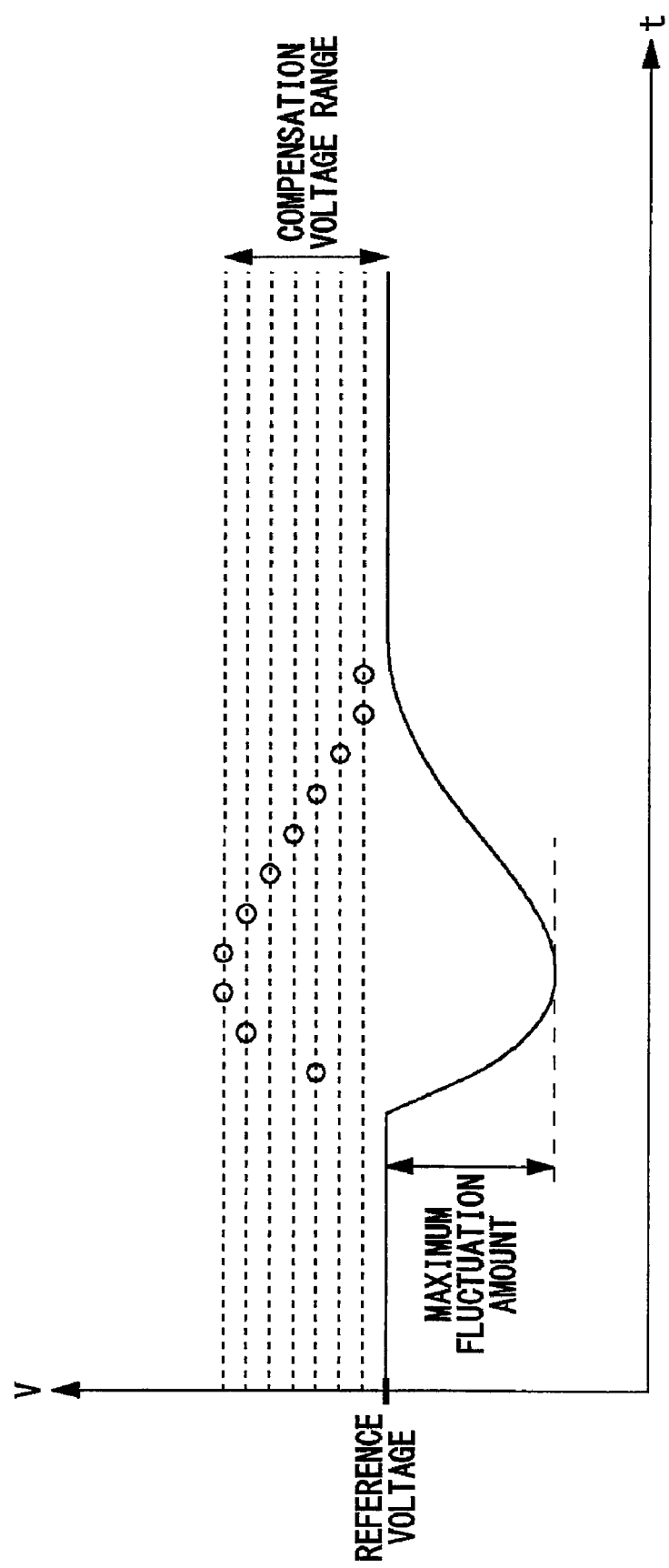

FIGS. 3A and 3B show an example of source voltage fluctuation compensation. FIG. 3A shows compensation when setting of the load fluctuation compensation circuit 40 is not optimized, while FIG. 3B shows compensation when setting of the load fluctuation compensation circuit 40 is optimized. In FIGS. 3A and 3B, the horizontal axis represents time, or a test pattern or an address block applied to the device under test 200, and the vertical axis represents a voltage value of the source voltage supplied to the device under test 200.

The load fluctuation compensation circuit 40 generates a current for compensating the fluctuation in a predetermined response period as shown by the round marks in FIGS. 3A and 3B, in accordance with the fluctuation of the source voltage shown by the solid line in FIGS. 3A and 3B. The waveform of the voltage compensated by the compensation current generated by the load fluctuation compensation circuit 40 may desirably be a waveform that is in accordance with the fluctuation waveform of the source voltage.

However when setting of the load fluctuation compensation circuit 40 is not optimized, if a voltage range that can be compensated is large with respect to the fluctuation amount of the source voltage as shown in FIG. 3A, a number of levels of a compensation current unused for compensation of the source voltage arises. This results in decrease in the number of levels used in compensation of the source voltage. In view of this, a largely distorted waveform is used to compensate the source voltage, as shown in FIG. 3A.

As opposed to this, when setting of the load fluctuation compensation circuit 40 is optimized, it is possible to adequately set the current range and the resolution power of the compensation current, in accordance with the maximum value of the fluctuation of the source voltage, thereby enabling effective use of a predetermined number of compensation levels. This results in more accurate compensation of the fluctuation of the source voltage.

Figure 4:
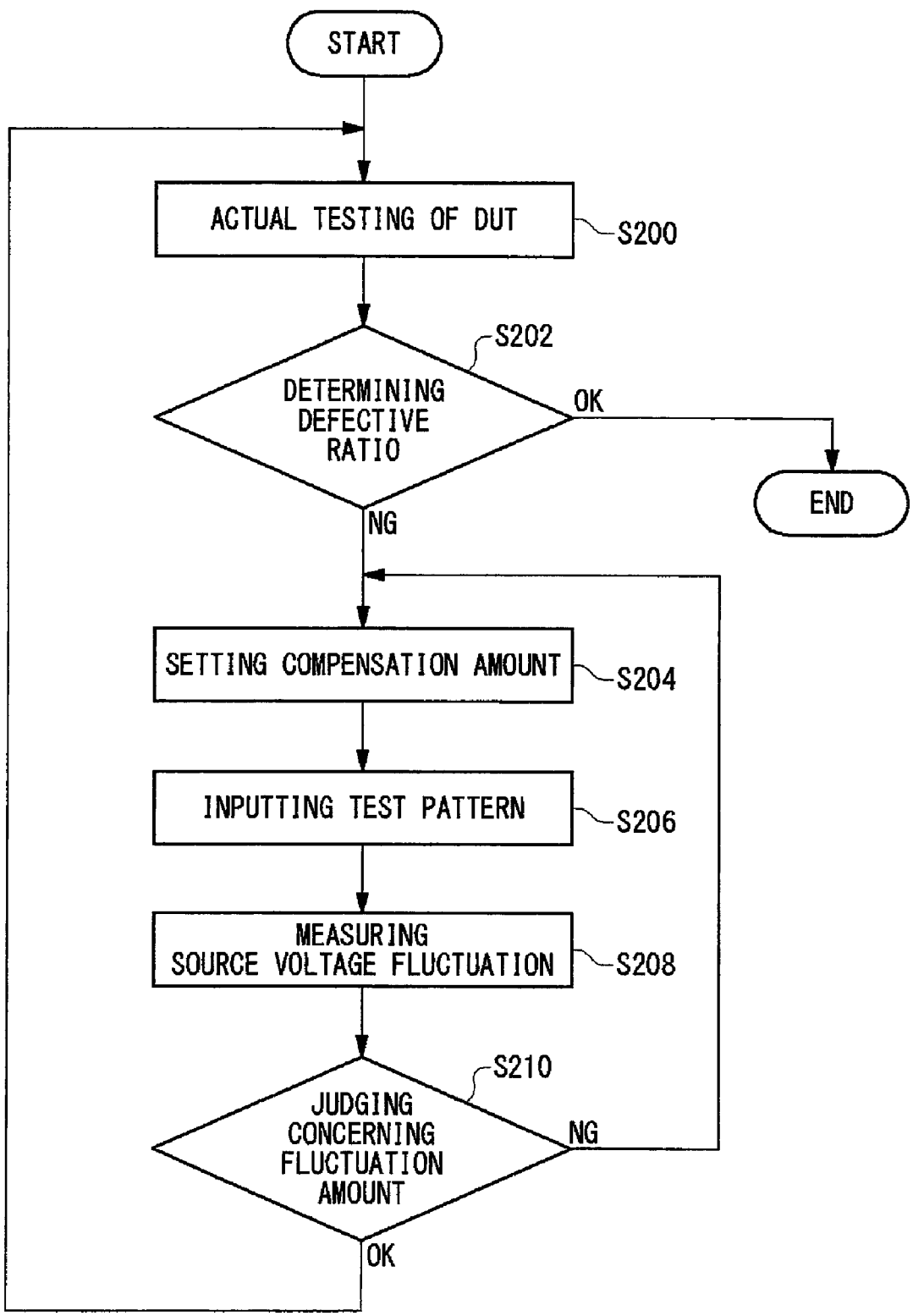
FIG. 4 is a flowchart showing one example of the operation of the test apparatus 100.

FIG. 4 is a flowchart showing one example of the operation of the test apparatus 100. This example explains a case where setting of the load fluctuation compensation circuit 40 is optimized after the actual testing of the device under test 200.

First, the test apparatus 100 performs actual testing of a plurality of devices under test 200 (S200). The plurality of devices under test 200 tested in S200 may be devices manufactured by the same design.

Next, in actual testing of the devices under test 200, it is judged whether the defective ratio of the devices under test 200 is higher than a predetermined reference value (S202). A control unit controlling the test apparatus 100 may perform the judgment in S202, or a user of the test apparatus 100 may perform the judgment in S202. The control unit or the user notifies the test apparatus 100 of the judgment result in S202.

When the defective ratio in the actual testing is smaller than a reference value, the test apparatus 100 ends the testing of the devices under test 200. When the defective ratio in the actual testing is larger than the reference value, the test apparatus 100 performs processing to optimize the setting of the load fluctuation compensation circuit 40 (S204-S210).

When optimizing the setting of the load fluctuation compensation circuit 40, the setting section 20 sets the current range and the resolution power for the load fluctuation compensation circuit 40 (S204). In S204, the current range and the resolution power may be increased by a predetermined value.

Next, the pattern generating section 10 inputs the test pattern to the device under test 200 (S206). Then the measuring section 30 measures the fluctuation amount of the source voltage that results when the test pattern is inputted to the device under test 200 (S208). As described above, the test pattern may be a predetermined test pattern that maximizes the fluctuation amount of the source voltage. In addition, when a plurality of test patterns are inputted to a device under test 200, the processing of S206 and S208 may be performed for each test pattern, to measure the source voltage for each test pattern.

Next, the setting section 20 judges, based on the measured fluctuation amount, whether the compensation amount (current range and resolution power) set in S204 is optimal or not (S210). In S210, the compensation amount set in S204 may be judged as optimal if the fluctuation amount of source voltage measured in S208 is the minimum. For example, when the possible compensation amount for the load fluctuation compensation circuit 40 is smaller than the maximum value of the fluctuation amount of the source voltage to be compensated and when the possible compensation amount is gradually increased in S204, the fluctuation amount of the source voltage after compensation gradually decreases. Then at a certain compensation amount, the fluctuation amount of the source voltage approximates 0, to stop fluctuating. The setting section 20 may determine this compensation amount as an optimal value.

When the fluctuation amount measured in S208 is smaller than a predetermined reference value, the setting section 20 may determine a corresponding compensation amount as an optimal value. The setting section 20 may also detect the compensation amount at which the fluctuation of the source voltage becomes the minimum, by changing the compensation amount across the entire variable range. Also when measuring the fluctuation amount of the source voltage for a plurality of test patterns in S206 and S208, the compensation amount at which the average of the fluctuation amount becomes the minimum may be judged as optimal.

When the compensation amount set in S204 is judged as not being optimal, the processing of S204 through S208 is repeated. Specifically, the setting section 20 sequentially changes the compensation amount for the load fluctuation compensation circuit 40, and the pattern generating section 10 repeatedly inputs a plurality of test patterns or a predetermined test pattern to the device under test 200 each time the setting section 20 sets a new compensation amount.

Each time the setting section 20 changes the compensation amount of the load fluctuation compensation circuit 40, the setting section 20 measures the fluctuation amount of the source voltage after compensated by the load fluctuation compensation circuit 40. Then the setting section 20 detects an optimal compensation amount at which the fluctuation amount of the source voltage after compensation becomes the minimum, and performs the actual testing of the device under test 200 maintaining the optimal compensation amount. According to such processing, it is possible to rapidly and accurately compensate the fluctuation of the source voltage of the device under test 200, and to make accurate judgment concerning pass/fail of the device under test 200.

Figure 5:
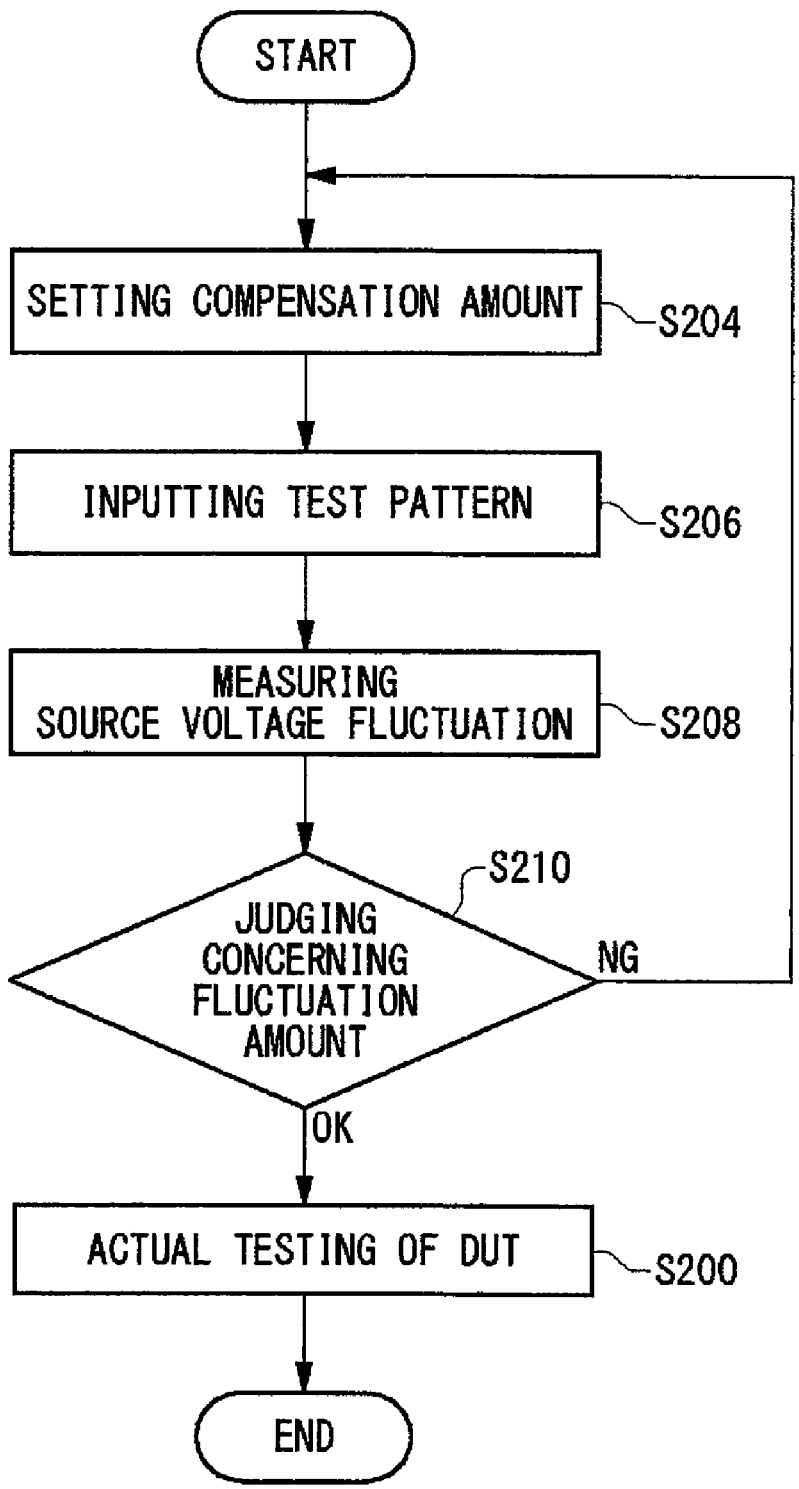
FIG. 5 is a flowchart showing another example of the operation of the test apparatus 100.

FIG. 5 is a flowchart showing another example of the operation of the test apparatus 100. In the present example, processing to optimize setting of the load fluctuation compensation circuit 40 (S204 through S210) is performed prior to actual testing of the device under test 200 (S200). The operation of the test apparatus 100 in each processing is the same as the corresponding processing in FIG. 4. According to such processing, it is possible to optimize the setting of the load fluctuation compensation circuit 40 prior to the actual testing, and to accurately test the device under test 200.

Figure 6:
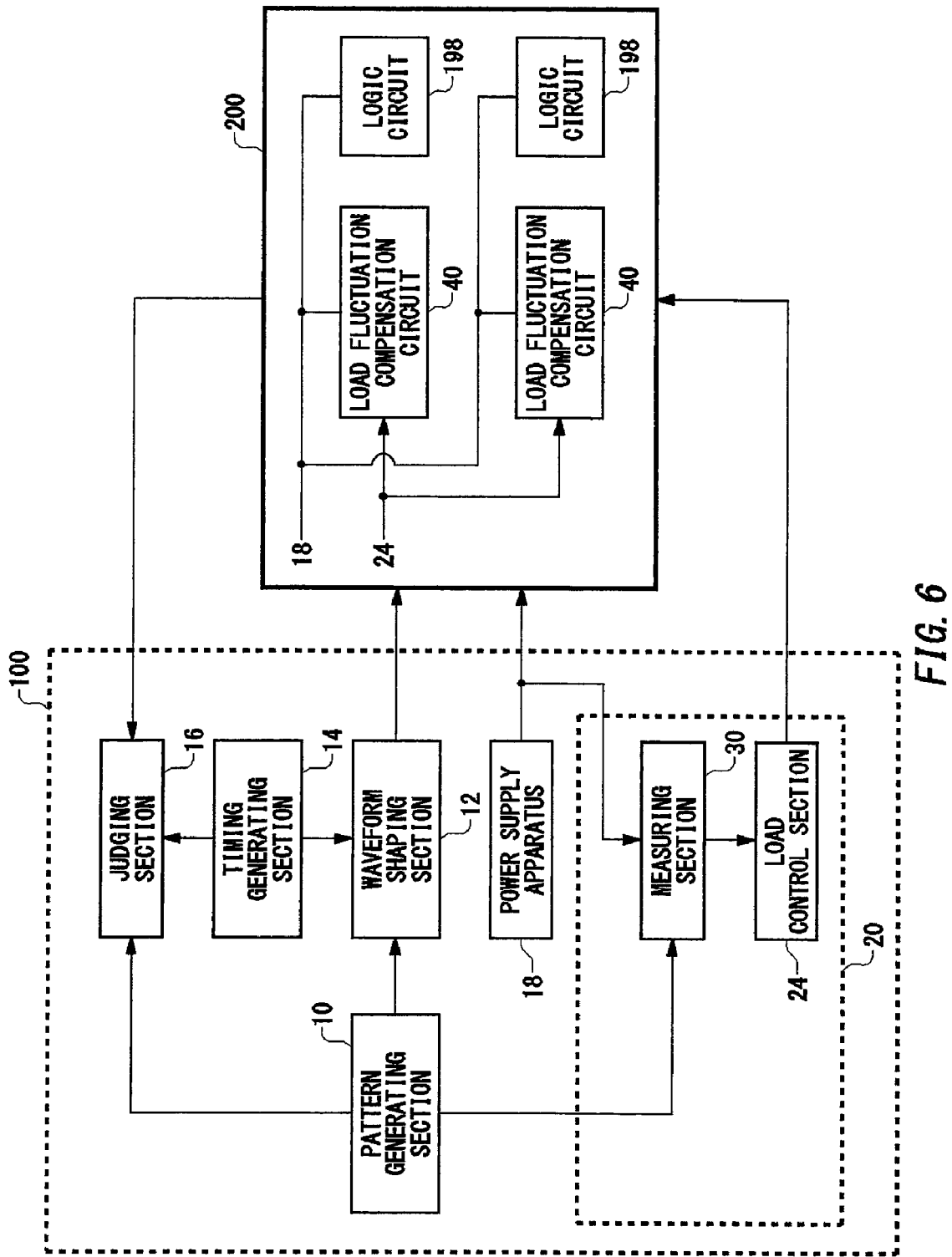
FIG. 6 shows another example of the configuration of the test apparatus 100.

FIG. 6 shows another example of the configuration of the test apparatus 100. In the present example, the device under test 200 includes the load fluctuation compensation circuit 40 explained with reference to FIG. 1. That is, the test apparatus 100 in the present example has the same configuration and function as those of the test apparatus 100 explained with reference to FIG. 1, except that the test apparatus 100 in the present example does not include the load fluctuation compensation circuit 40.

The device under test 200 includes a plurality of blocks of logic circuit 198 (internal circuit), and a plurality of load fluctuation compensation circuits 40 provided to correspond to the plurality of logic circuits 198. Each load fluctuation compensation circuit 40 is provided so that at least part of the corresponding logic circuit 198 and the power supply wiring is common. In the present example, a load fluctuation compensation circuit 40 is provided as a branch from the power supply wiring that is provided inside the device under test 200 and that transmits the source power supplied from an external power supply apparatus 18 to a logic circuit 198.

In addition, the device under test 200 includes a terminal for electrically connecting a load fluctuation compensation circuit 40 and a load control section 24 provided in the test apparatus 100. The load control section 24 sets the voltage range and the resolution power of voltage compensation for each load fluctuation compensation circuit 40, just as the load control section 24 explained with reference to FIG. 1.

According to such a configuration, it is possible to set the voltage range and the resolution power of voltage compensation to an appropriate value according to a test program, with respect to a load fluctuation compensation circuit 40 included in a device under test 200. In a device under test 200, when the setting value of a load fluctuation compensation circuit 40 is set by an anti-fuse method that is not rewritable, the test apparatus may desirably write the setting to the device under test 200. By doing so, the device under test 200 can operate accurately even when it is mounted after shipment.

Moreover, the test apparatus 100 shown in FIG. 1 and FIG. 6 may detect the fluctuation amount of a source voltage at which the device under test 200 does not operate erroneously. For example, by generating a compensation current in which the sign is inverse with respect to the compensation current to be generated in compensating the source voltage, it is possible to provide a device under test 200 with a fluctuation of source voltage that is larger than a normal fluctuation amount of source voltage. In view of this, it is possible to set the source voltage applied to the device under test 200 to a desirable value, by controlling the sign of the compensation current and the absolute value of the compensation current.

For example, the fluctuation amount of the source voltage at which the device under test 200 operates erroneously is detected by performing a functional test of the device under test 200 while gradually changing the compensation current value generated by the load fluctuation compensation circuit 40 and gradually changing the source voltage applied to the device under test 200. According to such control, it is possible to evaluate to what extent the source voltage fluctuation should be restrained in a device under test 200 so as to prevent the device under test 200 from erroneously operating.

Figure 7:
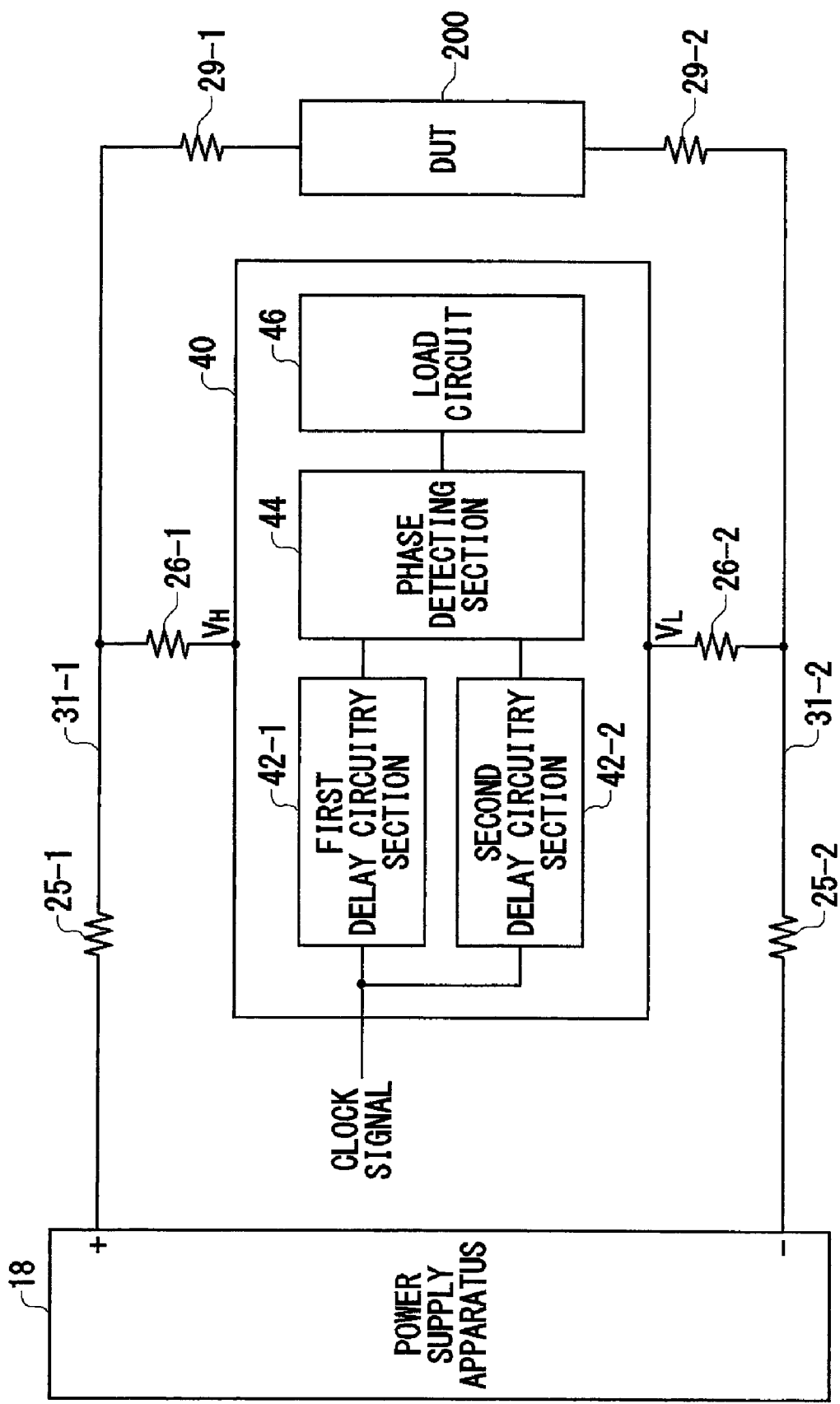
FIG. 7 shows one example of the configuration of a load fluctuation compensation circuit 40.

FIG. 7 shows one example of the configuration of a load fluctuation compensation circuit 40. The load fluctuation compensation circuit 40 is provided as a branch from the power supply wiring 31 that supplies the source power from the power supply apparatus 18 to the device under test 200. The power supply apparatus 18 includes a positive output terminal and a negative output terminal, and is connected to the positive source power input terminal and the negative source power input terminal of the device under test 200, via positive power supply wiring 31-1 and negative power supply wiring 31-2 respectively.

In addition, the power supply wiring 31 is branched into the main power supply wiring (i.e. 29-1 and 29-2, hereinafter collectively referred to as "29") and the branch power supply wiring (i.e. 26-1 and 26-2, hereinafter collectively referred to as "26"), in the vicinity of the source power input terminal of the device under test 200. The main power supply wiring 29 connects between the power supply apparatus 18 and the device under test 200, and supplies the source power to the device under test 200. The branch power supply wiring 26 connects between the power supply apparatus 18 and the load fluctuation compensation circuit 40, and supplies the source power to the load fluctuation compensation circuit 40.

Here, the branch point in the vicinity of the source power input terminal of the device under test 200 may be positioned at which the impedance of the main power supply wiring 29 from the branch point to the device under test 200 is substantially zero or is substantially ignorable, for example. The branch point is provided so that the impedance of the main power supply wiring 29 from the branch point to the device under test 200 is smaller than the impedance of the power supply wiring 31 from the power supply apparatus 18 to the branch point. It is further desirable if the branch point be provided so that the impedance of the branch power supply wiring 26 is substantially zero or substantially ignorable.

The load fluctuation compensation circuit 40 compensates the fluctuation of the source power supplied to the device under test 200. In the present example, the load fluctuation compensation circuit 40 includes a first delay circuitry section 42-1, a second delay circuitry section 42-2, a phase detecting section 44, and a load circuit 46.

The first delay circuitry section 42-1 delays a supplied clock signal by the delay amount fluctuated by a predetermined first fluctuation amount with respect to the unit fluctuation amount of the source voltage supplied to the device under test 200. In addition, the second delay circuitry section 42-2 delays a supplied clock signal by the delay amount fluctuated by a predetermined second fluctuation amount that is larger than the first fluctuation amount, with respect to the unit fluctuation amount of the source voltage supplied to the device under test 200. In the present example, the first delay circuitry section 42-1 and the second delay circuitry section 42-2 are supplied with a source voltage via the branch power supply wiring 26, and fluctuate the delay amount in accordance with the fluctuation of the supplied source voltage.

The present example relates to a case where the second fluctuation amount in the second delay circuitry section 42-2 is larger than the first fluctuation amount in the first delay circuitry section 42-1. However the first fluctuation amount may be larger than the second fluctuation amount in a different example. It is sufficient if the first delay circuitry section 42-1 and the second delay circuitry section 42-2 have a different fluctuation for the delay amount with respect to the unit fluctuation amount of the source voltage from each other. The load fluctuation compensation circuit 40 is able to perform an equivalent operation even when either of the first fluctuation amount or the second fluctuation amount is larger than the other.

The load circuit 46 is provided in parallel with the device under test 200, and shares at least part of the power supply wiring with the device under test 200. In the present example, the load circuit 46 shares the power supply wiring 31 with the device under test 200, and receives the source power from the branch power supply wiring 26.

The phase detecting section 44 detects a phase difference between the clock signal outputted from the first delay circuitry section 42-1 and the clock signal outputted from the second delay circuitry section 42-2, and controls the consumption current amount consumed by the load circuit 46 based on the phase difference. For example, the load circuit 46 is a circuit that can switch whether to consume a predetermined consumption current via the branch power supply wiring 26 or not, and the phase detecting section 44 may switch whether to cause the load circuit 46 to consume the consumption current, based on which one of the clock signal outputted from the first delay circuitry section 42-1 and the clock signal outputted from the second delay circuitry section 42-2 has a more advanced phase. In addition, the load circuit 46 is a circuit that can fluctuate the consumption current amount, and the phase detecting section 44 may control the consumption current amount consumed by the load circuit 46 based on the phase difference.

Figure 8:
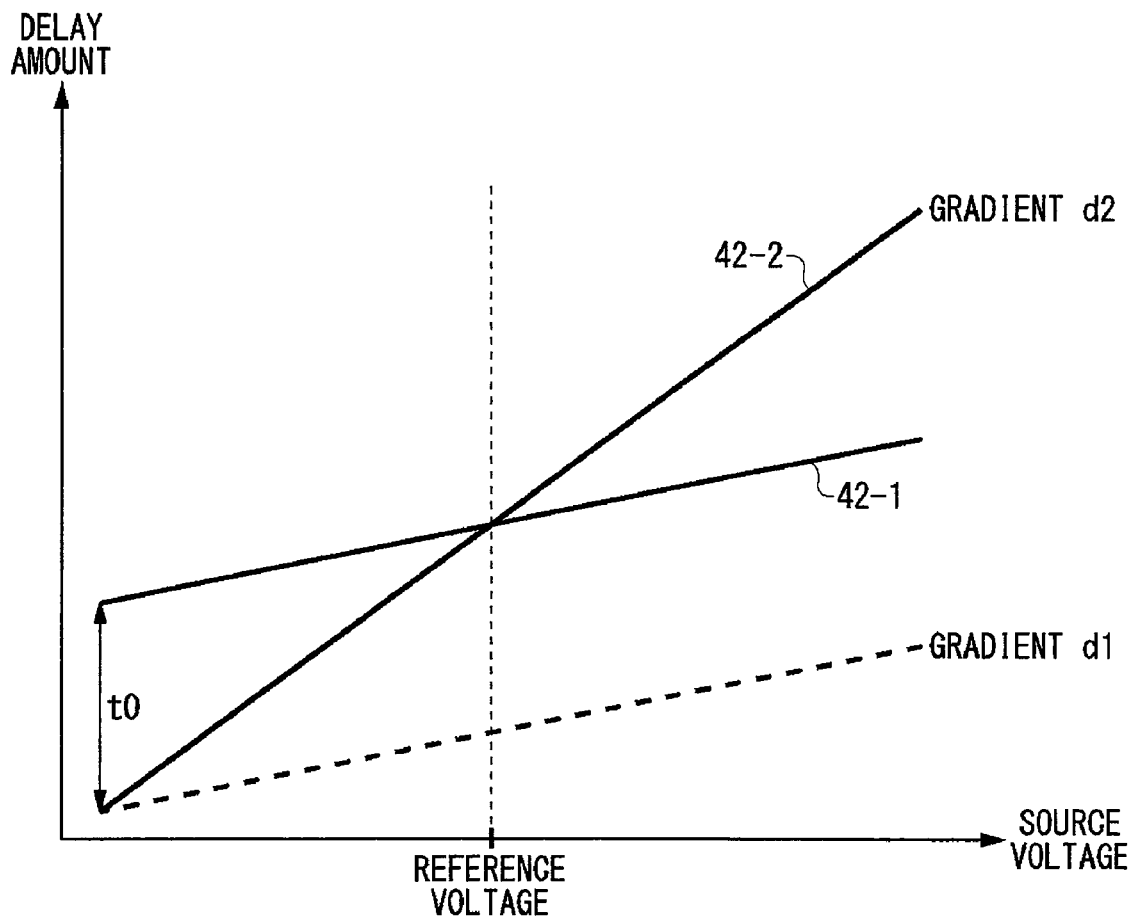
FIG. 8 shows one example of the relation between the source voltage and the delay amount, in the first delay circuitry section 42-1 and the second delay circuitry section 42-2.

FIG. 8 shows one example of the relation between the source voltage and the delay amount, in the first delay circuitry section 42-1 and the second delay circuitry section 42-2. The present example deals with a case where the second fluctuation amount is larger than the first fluctuation amount.

That is, as shown in FIG. 8, the present example deals with a case where the gradient of the source voltage/delay amount characteristic is larger for the second delay circuitry section 42-2 than for the first delay circuitry section 42-1.

The first delay circuitry section 42-1 and the second delay circuitry section 42-2 are designed to have the same delay amount when the source voltage supplied to the device under test 200 becomes a predetermined reference voltage. For example, the first delay circuitry section 42-1 includes a delay element whose gradient of (source voltage)/(delay amount characteristic) is smaller than that of the second delay circuitry section 42-2 and a phase difference generating section that inputs a supplied clock signal to the delay element by delaying the clock signal by the delay time t0, as shown by the dotted line in FIG. 8. By controlling the delay time t0 in the phase difference generating section, the delay amount may be made substantially the same between the first delay circuitry section 42-1 and the second delay circuitry section 42-2 at a desirable reference voltage. The reference voltage may be a voltage substantially the same as the source voltage to be supplied to a device under test 200, which for example may be a voltage substantially equal to the voltage rating of the device under test 200.

The phase detecting section 44 controls the consumption current amount consumed by the load circuit 46, so that the phase difference between the clock signal outputted from the first delay circuitry section 42-1 and the clock signal outputted from the second delay circuit 42-2 becomes a predetermined phase difference. In the present example, the phase detecting section 44 controls the consumption current amount consumed by the load circuit 46 so that the phase difference becomes substantially zero.

As shown in FIG. 8, the phase difference becomes substantially zero when the delay amount of the first delay circuitry section 42-1 becomes substantially equal to the delay amount of the second delay circuitry section 42-2. That is, the phase detecting section 44 controls the consumption current amount consumed by the load circuit 46, so that the source voltage supplied to the first delay circuitry section 42-1 and the second delay circuitry section 42-2 becomes a predetermined reference voltage shown in FIG. 8.

For example, when the consumption current amount by the device under test 200 has decreased, the voltage drop amount for the impedance component 25 of the power supply wiring 31 will decrease. In other words, the source voltage supplied to the device under test 200 becomes larger than a reference voltage. Therefore the delay amount for the second delay circuitry section 42-2 is larger than the delay amount for the first delay circuitry section 42-1 as shown in FIG. 8, the phase of the clock signal outputted by the first delay circuitry section 42-1 is more advanced than the phase of the clock signal outputted by the second delay circuitry section 42-2.

The phase detecting section 44 increases the consumption current amount of the load circuit 46, if the phase of the clock signal outputted by the first delay circuitry section 42-1 is more advanced than the phase of the clock signal outputted by the second delay circuitry section 42-2. For example, the load circuit 46 is set to the ON state to consume a predetermined consumption current. Since the load circuit 46 receives a source current through the power supply wiring 31, the source current amount running to the power supply wiring 31 will increase according to such control. As a result, it becomes possible to compensate the increase in source voltage that is attributable to the decrease in consumption current of the device under test 200.

When the consumption current amount of the device under test 200 has increased, the source voltage supplied to the device under test 200 will become smaller than a reference voltage in the similar manner. In this case, the phase of the clock signal outputted from the first delay circuitry section 42-1 will be delayed relative to the phase of the clock signal outputted from the second delay circuitry section 42-2.

The phase detecting section 44 decreases the consumption current amount of the load circuit 46, if the phase of the clock signal outputted by the first delay circuitry section 42-1 is delayed relative to the phase of the clock signal outputted by the second delay circuitry section 42-2. For example, the load circuit 46 is set to the OFF state to consume substantially zero current. As a result, it becomes possible to compensate the decrease in source voltage that is attributable to the increase in consumption current of the device under test 200.

The load fluctuation compensation circuit 40 in the present example is able to compensate the source voltage fluctuation attributable to the fluctuation of consumption current of the device under test 200 as explained above. In addition, because the source voltage fluctuation is compensated by controlling the consumption current of the load circuit 46 provided in the vicinity of the device under test 200 without feeding back the source voltage fluctuation to the power supply apparatus 18, it is possible to rapidly follow the load fluctuation. In particular, the source voltage fluctuation is compensated by switching ON/OFF of the load circuit 46, and so it is possible to rapidly follow the load fluctuation with a simple control.

Figure 9:
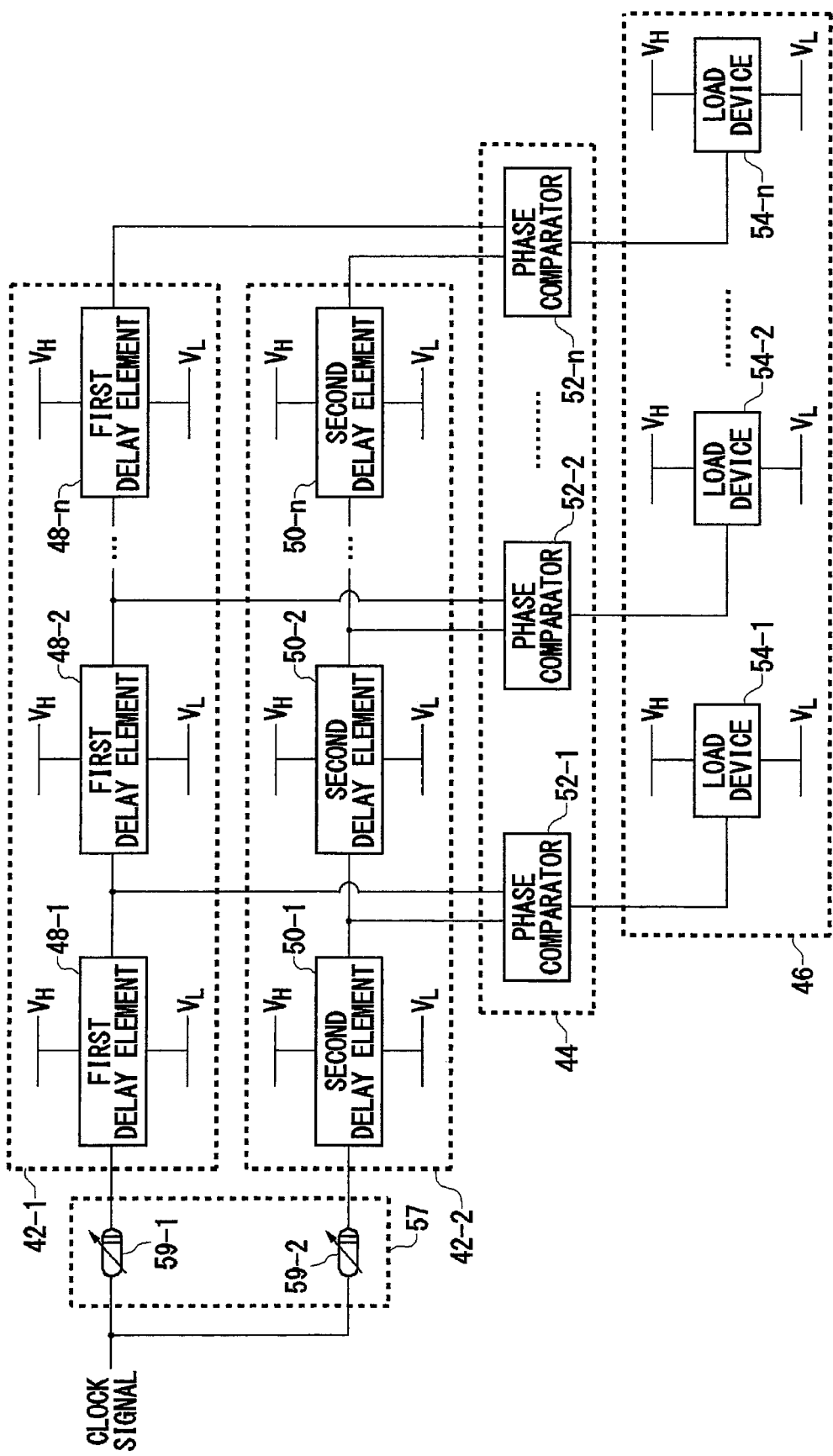
FIG. 9 shows another example of the configuration of the load fluctuation compensation circuit 40.

FIG. 9 shows another example of the configuration of the load fluctuation compensation circuit 40. The load fluctuation compensation circuit 40 in the present example, in addition to having the configuration of the load fluctuation compensation circuit 40 explained in FIG. 7, further includes a phase difference generating section 57. In addition, the first delay circuitry section 42-1 in the present example includes n first delay elements (where n is a natural number) connected serially (i.e. 48-1-48-n, hereinafter collectively referred to as "48"). The second delay circuitry section 42-2 in the present example includes n second delay elements connected serially (i.e. 50-1-50-n, hereinafter collectively referred to as "50"). The phase detecting section 44 includes n phase comparators (i.e. 52-1-52-n, hereinafter collectively referred to as "52"), and the load circuit 46 includes n load devices (i.e. 54-1-54-n, hereinafter collectively referred to as "54").

The plurality of first delay elements 48 are connected in a cascading manner, and sequentially delay a supplied clock signal. Each first delay element 48 is supplied with source voltages (VH, VL) from the branch power supply wiring 26, and causes the delay that is in accordance with the source voltages. The delay amount of each first delay element 48 is substantially the same. For example, the delay amount for each first delay element 48 may be a delay amount obtained by dividing the delay amount shown by the dotted line in FIG. 8 into "n". The delay amount for each first delay element is given by "d1×V" for example. Here, "d1" represents a fluctuation amount of the delay amount with respect to the unit fluctuation amount of the source voltage supplied to a first delay element 48, and is controlled by a bias voltage supplied to the first delay element 48 for example. "V" represents a source voltage supplied to a first delay element 48.

The plurality of second delay elements 50 are connected in a cascading manner, and sequentially delay a supplied clock signal. Each second delay element 50 is supplied with source voltages (VH, VL) from the branch power supply wiring 26, and causes the delay that is in accordance with the source voltages. The delay amount of each second delay element 50 is substantially the same. For example, the delay amount for each second delay element 50 may be a delay amount obtained by dividing the delay amount of the second delay circuitry section 42-2 shown in FIG. 8 into "n". The delay amount for each second delay element 50 is given by "d2×V" for example. Here, "d2" represents a fluctuation amount of the delay amount with respect to the unit fluctuation amount of the source voltage supplied to a second delay element 50, and is controlled by a bias voltage supplied to the second delay element 50 for example. "V" represents a source voltage supplied to a second delay element 50, and is substantially the same as the source voltage supplied to the first delay element 48. Moreover, the fluctuation amount (d2) of the delay amount with respect to the unit fluctuation amount of the source voltage in the second delay element 50 is larger than the fluctuation amount (d1) of the delay amount with respect to the unit fluctuation amount in the first delay element 48.

The phase difference generating section 57 generates a predetermined phase difference between the clock signal inputted to the first delay circuitry section 42-1 and the clock signal inputted to the second delay circuitry section 42-2. In the present example, the phase difference generating section 57 includes at least one of a variable delay circuit 59-1 that delays a clock signal inputted to the first delay circuitry section 42-1 and a variable delay circuit 59-2 that delays a clock signal inputted to the second delay circuitry section 42-2, and delays either of the clock signal inputted to the first delay circuitry section 42-1 and the clock signal inputted to the second delay circuitry section 42-2 by a predetermined time. In addition, the delay amount of the variable delay circuit 59 is constant regardless of the source voltage supplied to the load fluctuation compensation circuit 40. The load fluctuation compensation circuit 40 may desirably include means for supplying a constant source voltage to the variable delay circuit 59.

In the present example, when the source voltage supplied to the device under test 200 becomes a predetermined reference voltage, the phase difference generating section 57 delays the clock signal supplied to the first delay circuitry section 42-1 or to the second delay circuitry section 42-2, so that the phase of the clock signal outputted from a first delay element 48 positioned substantially in the middle stage of the first delay circuitry section 42-1 is substantially the same as the phase of the clock signal outputted from a second delay element 50 positioned substantially in the middle stage of the second delay circuitry section 42-2. For example, when the delay amount of the second delay element 50 is larger than the delay amount of the first delay element 48, the clock signal inputted to the first delay circuitry section 42-1 is delayed by a predetermined time.

The plurality of phase comparators 52 are provided to correspond to the plurality of first delay elements 48 and the plurality of second delay elements 50. Each phase comparator 52 detects a phase difference between clock signals respectively outputted from a corresponding first delay element 48 and a corresponding second delay element 50. In the present example, the phase of the clock signal supplied to the first delay circuitry section 42-1 is delayed relative to the phase of the clock signal supplied to the second delay circuitry section 42-2, and the delay amount of the second delay element 50 is larger than the delay amount of the first delay element 48, and so the phase relation with respect to the clock signal outputted from a delay element at a certain stage is reversed in the first delay circuitry section 42-1 and the second delay circuitry section 42-2.

For example, for each delay element positioned in the upper stream with respect to the delay element at the certain stage, the phase of the clock signal outputted from the first delay element 48 is delayed relative to the phase of the clock signal outputted form the second delay element 50. For each delay element positioned in the lower stream with respect to the delay element at the certain stage, the phase of the clock signal outputted from the first delay element 48 is more advanced than the phase of the clock signal outputted form the second delay element 50. Therefore, a phase comparator 52 corresponding to a delay element positioned in the upper stream with respect to the delay element at the certain stage outputs a signal of an H logic as a phase comparison result for example, and a phase comparator corresponding to a delay element positioned at or after the delay element at the certain stage outputs a signal of an L logic as a phase comparison result for example.

The plurality of load devices 54 are provided to correspond to the plurality of phase comparators 52. Each load device 54 switches whether to consume a predetermined current amount, according to a comparison result of a corresponding phase comparator 52. In addition, each load device 54 is provided in parallel to the device under test 200, and shares at least part of the power supply wiring with the device under test 200. In the present example, a load device 54 shares the power supply wiring 31 with the device under test 200, and receives a source power from the branch power supply wiring 26. A predetermined current amount for each load device 54 may be the same as each other.

In the present example, each phase comparator 52 controls a corresponding load device 54 to the ON state, if the phase of the clock signal outputted from a corresponding first delay element 48 is more advanced than the phase of the clock signal outputted from a corresponding second delay element 50, to consume a predetermine current amount. Each phase comparator 52 controls a corresponding load device 54 to the OFF state, if the phase of the clock signal outputted from a corresponding first delay element 48 is delayed relative to the phase of the clock signal outputted from a corresponding second delay element 50, to control the consumption current amount to substantially zero.

Figure 10:
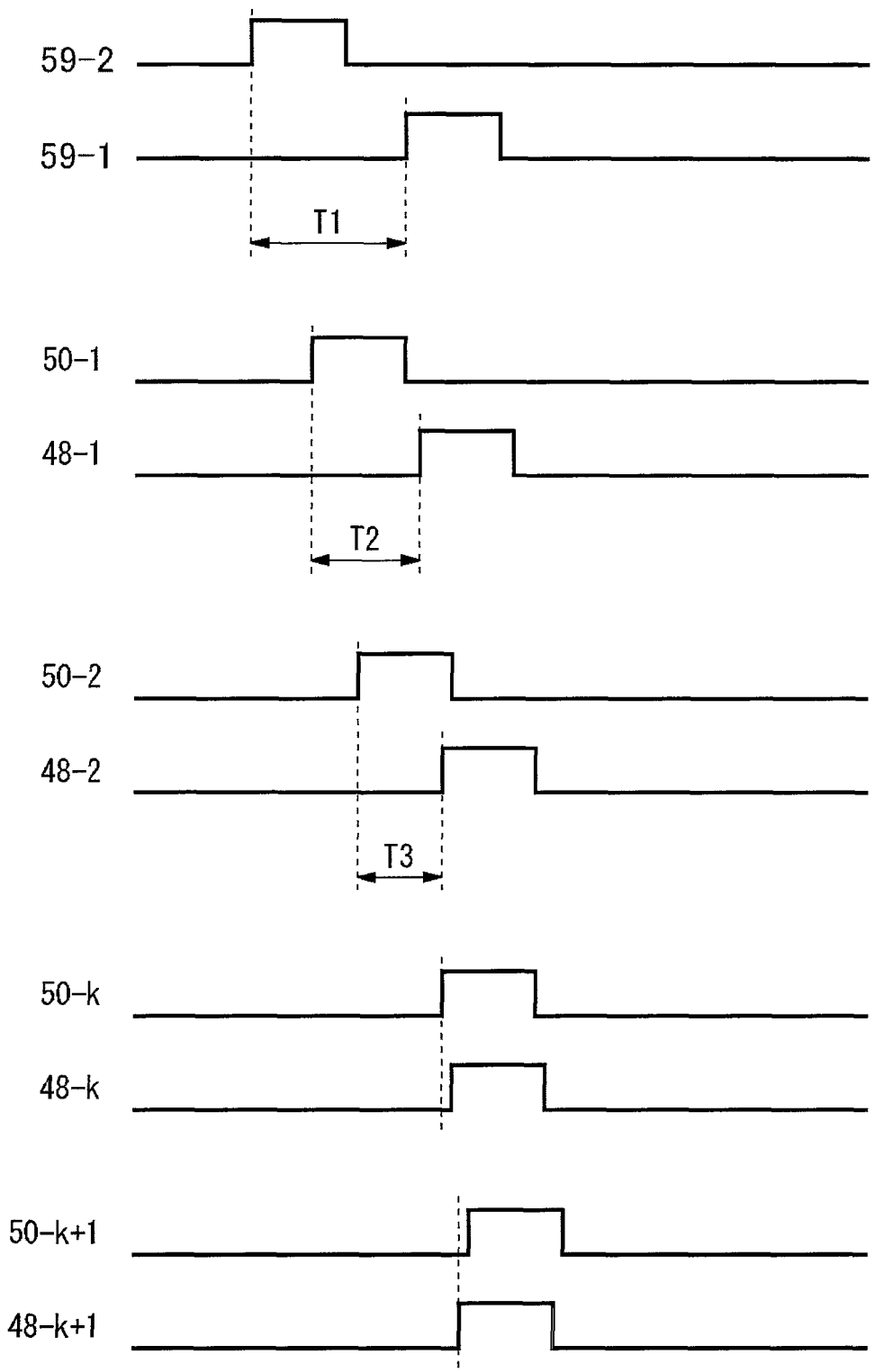
FIG. 10 is a timing chart explaining one example of the operation of the load fluctuation compensation circuit 40 explained in FIG. 9.

FIG. 10 is a timing chart explaining one example of the operation of the load fluctuation compensation circuit 40 explained in FIG. 9. In the present example, the phase difference generating section 57 inputs the phase of the clock signal inputted to the first delay circuitry section 42-1 by delaying it by a predetermined time of "T1" relative to the phase of the clock signal inputted to the second delay circuitry section 42-2. Also in the present example, the delay amount of the second delay element 50 is larger than the delay amount of the first delay element 48.

First, the variable delay circuit 59-1 and the variable delay circuit 59-2 supply respective clock signals to the first delay circuitry section 42-1 and the second delay circuitry section 42-2. As described above, the phase of the clock signal inputted to the first delay circuitry section 42-1 is delayed relative to the phase of the clock signal inputted to the second delay circuitry section 42-2, by a predetermined phase difference "T1".

The first delay element 48-1 and the second delay element 50-1 output respectively supplied clock signals after delaying them. As described above, the delay amount for the second delay element 50-1 is larger than the delay amount for the first delay element 48-1. As a result, the phase difference "T2" between the clock signal outputted from the first delay element 48-1 and the clock signal outputted from the second delay element 50-1 is a value "T2" obtained by subtracting, from the phase difference "T1", a delay difference between the first delay element 48-1 and the second delay element 50-2.

The phase difference between each clock signal gradually decreases as each clock signal is caused to pass through a plurality of first delay elements 48 and a plurality of second delay elements 50, to result in reversal of the clock signal phase relation at a predetermined first delay element 48-(k+1) and a predetermined second delay element 50-(k+1). As described above, a phase comparator 52 compares the phases of clock signals respectively outputted from a corresponding first delay element 48 and a corresponding second delay element 50, and controls a corresponding load device 54 either to the ON state or the OFF state according to the comparison result.

The stage at which the phase of each clock signal reverses is determined by the initial phase difference "T1" and a delay difference between the first delay element 48 and the second delay element 50. For example, the initial phase difference "T1" is set so that, when the source voltage supplied to the device under test 200 has become a predetermined reference voltage for example, the phase of the clock signal outputted from a first delay element 48 substantially in the middle stage of the first delay circuitry section 42-1 is substantially the same as the phase of the clock signal outputted from a second delay element 50 substantially in the middle stage of the second delay circuitry section 42-2.

The delay amount of the first delay element 48 and the second delay element 50 fluctuates according to the source voltage supplied to the device under test 200. For this reason, at which stage the clock signal phase relation reverses is defined by a supplied source voltage. For example, when the source voltage is smaller than a reference voltage, the delay difference between the first delay element 48 and the second delay element 50 decreases compared to the state where the reference voltage is supplied. For this reason, the stage at which the clock signal phase relation reverses moves to more downstream than the middle stage, by the number of stages that is in accordance with the fluctuation amount of the source voltage with respect to the reference voltage.

In this case, the number of load devices 54 brought to the ON state decreases according to the number of moved stages, and the consumption current in the load circuit 46 decreases. Accordingly, the voltage drop amount for the power supply wiring 31 decreases, thereby enabling to compensate the fluctuation of the source voltage supplied to the device under test 200.

Figure 11:
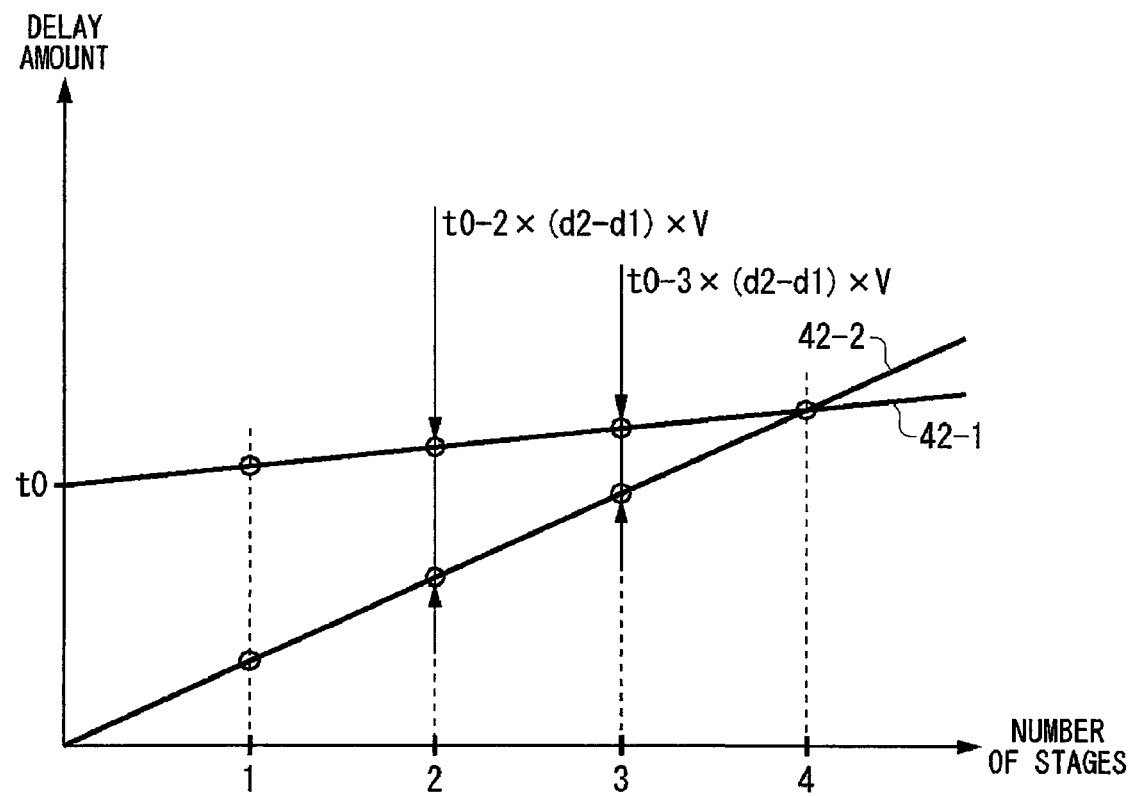
FIG. 11 shows a delay time of a clock signal outputted by a delay element of each stage in the first delay circuitry section 42-1 and the second delay circuitry section 42-2.

FIG. 11 shows a delay time of a clock signal outputted by a delay element of each stage in the first delay circuitry section 42-1 and the second delay circuitry section 42-2. As explained with reference to FIG. 10, the phase of the clock signal outputted from each delay element reverses at a stage according to a delay difference between the first delay element 48 and the second delay element 50. As shown in FIG. 11, for one stage of delay element, the delay difference between the first delay element 48 and the second delay element 50 is given by $(d2-d1) \times V$. The delay difference is proportionate to the source voltage, thereby it would be understood that the stage at which the phase reverses changes according to the source voltage. The load fluctuation compensation circuit 40 may compensate the fluctuation of the source voltage within the voltage range in which the relation between the fluctuation amount of the source voltage and the fluctuation amount of the stage at which the phase reverses is approximated linearly.

Figure 12:
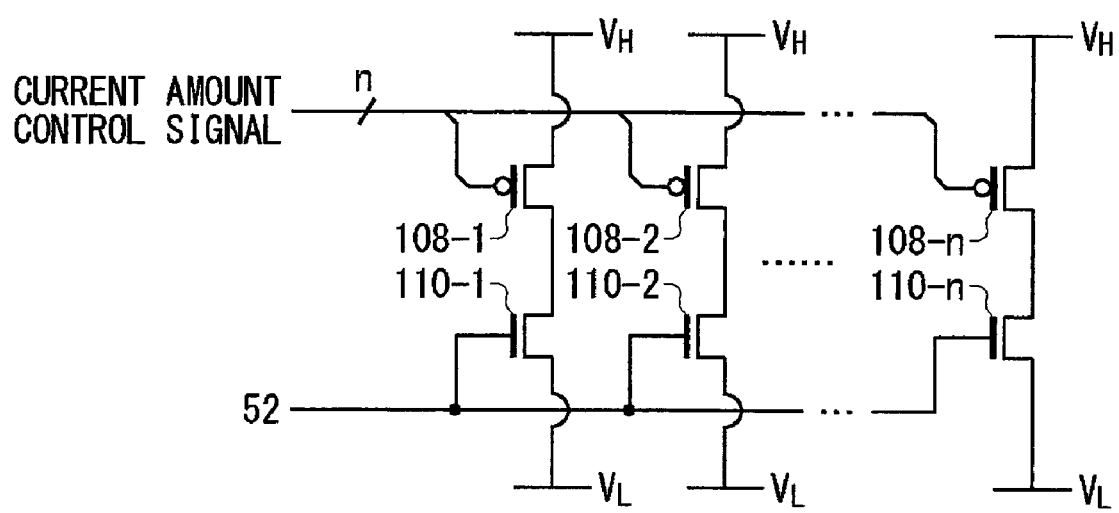
FIG. 12 shows one example of the configuration of a load device 54.

FIG. 12 shows one example of the configuration of a load device 54. The load device 54 includes a plurality of stages of transistors 108 and transistors 110 serially connected between the branch power supply wiring 26-1 and the branch power supply wiring 26-2. Each stage of transistor 108 is a PMOS transistor for example, whose source terminal is connected to the branch power supply wiring 26-1 and whose drain terminal is connected to the drain terminal of the transistor 110, and receives, at the gate terminal thereof, a corresponding bit signal of the current amount control signal.

Each transistor 110 (corresponding to each stage) is a NMOS transistor for example, whose source terminal is connected to the branch power supply wiring 26-2 and whose drain terminal is connected to the drain terminal of the transistor 108, and receives, at the gate terminal thereof, a comparison result signal outputted from a corresponding phase comparator 52.

That is, the number of transistors 108 set to the ON state may be controllable by a current amount control signal. In addition, all the transistors 110 may be controlled to the ON state or the OFF state collectively, according to the comparison result of the phase comparator 52. Consequently, when the phase comparator 52 has controlled the load device 54 to the ON state by means of a current amount control signal, the current amount to be consumed by the load device 54 can be controlled to a desirable value.

As mentioned above, the load control section 24 controls the current amount to be consumed by the load device 54 to a desirable value, by means of a current amount control signal. In other words, the resolution power of the current to be consumed by the load circuit 46 is controlled. Accordingly, it is possible to control the voltage range and the resolution power of the voltage compensation. For example, the load control section 24 may adjust the current amount to be consumed by each load device 54, so that the maximum value of the fluctuation amount of the current consumed by the device under test 200 becomes substantially the same as the maximum value of the fluctuation amount of the current consumed by the load circuit 46.

Figure 13:
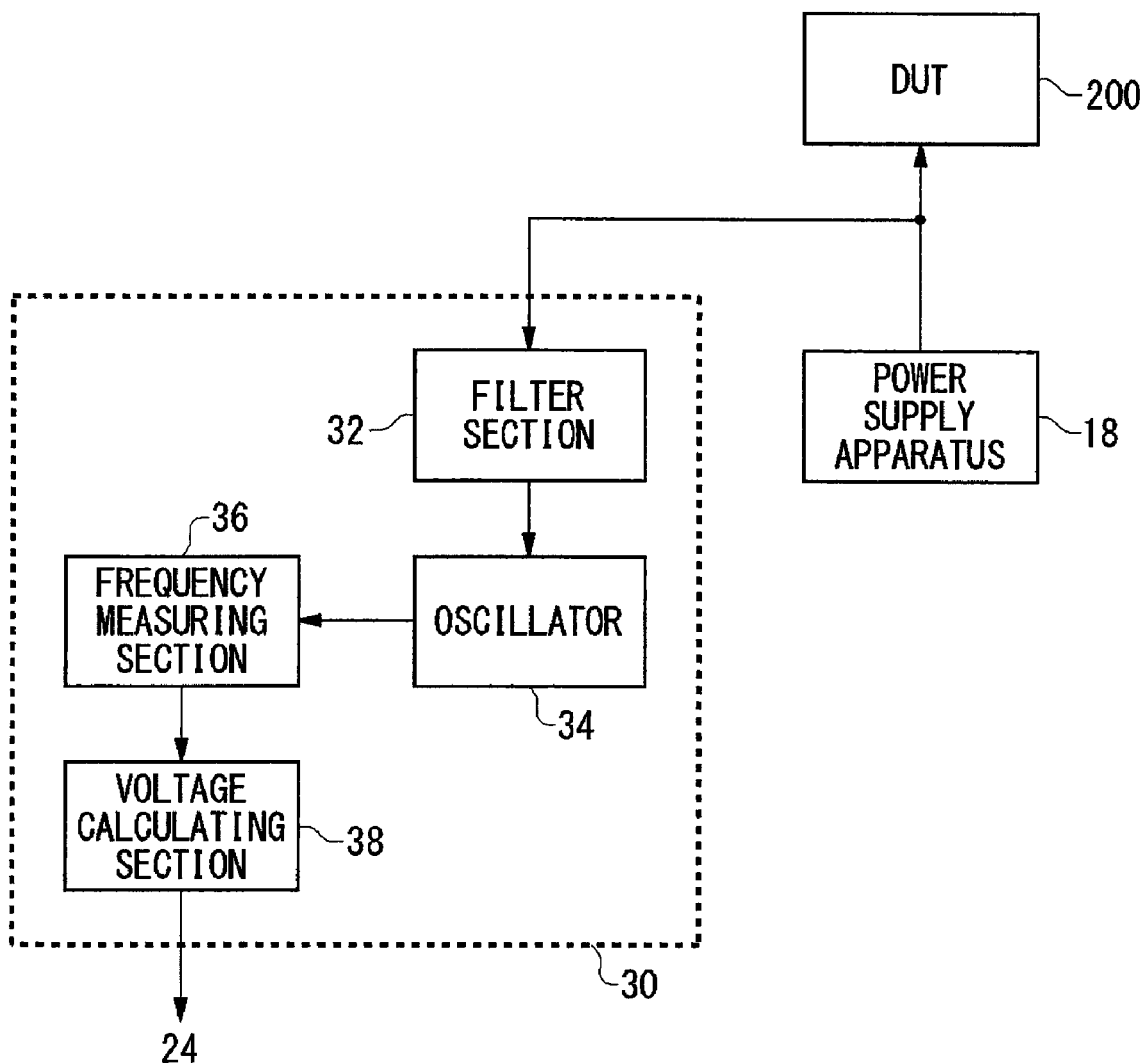
FIG. 13 shows one example of the configuration of a measuring section 30.

FIG. 13 shows one example of the configuration of a measuring section 30. The measuring section 30 in the present example includes a filter section 32, an oscillator 34, a frequency measuring section 36, and a voltage calculating section 38. The filter section 32 receives a source voltage supplied to the source power input terminal of the device under test 200. Then the filter section 32 removes a DC component of an inputted source voltage, superimposes an extracted AC component to a predetermined voltage level, and outputs the result. Accordingly, the filter section 32 outputs a voltage that fluctuates with reference to a predetermined voltage level and by a fluctuation amount of the source voltage. The voltage level may be the reference voltage described earlier. In another example, the oscillator 34 may receive the source voltage applied to the device under test 200 without through the filter section 32.

The oscillator 34 generates a clock signal having a frequency that is in accordance with the voltage supplied from the filter section 32. That is, the oscillator 34 outputs a clock signal having a frequency that is in accordance with the source voltage from which the DC component is removed. In the present embodiment, the oscillator 34 generates a clock signal that has a higher frequency as the source voltage becomes higher, and that has a lower frequency as the source voltage becomes lower.

The frequency measuring section 36 measures the frequency of a clock signal outputted from the oscillator 34. More specifically, the frequency measuring section 36 measures the number of pulses of the clock signal within a predetermined reference period (e.g. during a predetermined period of a reference clock). The voltage calculating section 38 measures the source voltage of the device under test 200, based on the frequency of the clock signal measured by the frequency measuring section 36.

The voltage calculating section 38 may be informed of, in advance, a relation between the frequency of the clock signal and the source voltage supplied to the oscillator 34. The voltage calculating section 38 notifies the load control section 24 of the measured source voltage. As mentioned earlier, the load control section 24 controls the resolution power of the current consumed by the load circuit 46 based on the notified voltage value. The load control section 24 may be informed of, in advance, a relation between the fluctuation amount of the source voltage and the resolution power of the consumption current of the load circuit 46 to be set. The relation can be calculated based on the resistance value of the impedance component 25 in the power supply wiring 31.

As is clear from the foregoing, according to one aspect of the present invention, it is possible to rapidly follow the fluctuation of the consumption current and the source voltage, by providing a load fluctuation compensation circuit either inside or in the vicinity of a device under test. Furthermore, it is possible to set the compensation range and the compensation resolution power in the load fluctuation compensation circuit to an appropriate value. Consequently, it is possible to accurately compensate the fluctuation of the consumption current and the source voltage and to accurately test a device under test.

Although some aspects of the present invention have been described by way of exemplary embodiments, it should be understood that those skilled in the art might make many changes and substitutions without departing from the spirit and the scope of the present invention which is defined only by the appended claims.

What is claimed is:

1. A test apparatus configured to test a device under test, the test apparatus comprising:
    a pattern generating section that inputs a test pattern to the device under test;
    a judging section that judges whether the device under test is defective or not, based on an output signal outputted from the device under test;
    a power supply apparatus that supplies a source power to the device under test;
    a setting section that detects a fluctuation amount of the source voltage resulting when the test pattern is inputted to the device under test, and sets, based on the detected fluctuation amount, a current range within which a compensation current that is in accordance with a fluctuation of a consumption current consumed by the device under test can be generated so as to compensate a fluctuation of a source voltage to be applied to the device under test attributable to the fluctuation of the consumption current, the current range having a predetermined number of levels that the compensation current can take; and
    a load fluctuation compensation circuit that, so as to compensate a fluctuation of a source voltage to be applied to the device under test attributable to a fluctuation of a consumption current consumed by the device under test, generates a compensation current that is in accordance with the fluctuation of the consumption current within the set current range and at a predetermined number of levels, wherein
    the load fluctuation compensation circuit includes:
        a first delay circuitry section that delays a supplied clock signal by a delay amount fluctuated by a predetermined first fluctuation amount with respect to a unit fluctuation amount of a source voltage supplied to the device under test;
        a second delay circuitry section that delays a supplied clock signal by a delay amount fluctuated by a second fluctuation amount that is larger than the first fluctuation amount, with respect to the unit fluctuation amount of the source voltage supplied to the device under test, the second delay circuitry section being provided to be parallel with the first delay circuitry section;
    a load circuit provided to be parallel with the device under test and sharing at least part of power supply wiring with the device under test; and
    a phase detecting section that detects a phase difference between the clock signal outputted from the first delay circuitry section and the clock signal outputted from the second delay circuitry section, and adjusts a consumption current amount consumed by the load circuit, within the current range set by the setting section and at the number of levels based on the phase difference.

2. The test apparatus as set forth in claim 1, wherein
the pattern generating section sequentially inputs a plurality of test patterns to be inputted at a time of actual testing of the device under test, to the device under test, and
the setting section detects the fluctuation amount of the source voltage for each of the test patterns, or for each address block of each of the test patterns, and sets the current range in the load fluctuation compensation circuit based on the maximum value of the detected fluctuation amount of the source voltage.

3. The test apparatus as set forth in claim 2, wherein
the pattern generating section inputs the test pattern to the device under test prior to actual testing of the device under test, and
the setting section sets the current range in the load fluctuation compensation circuit, prior to the actual testing of the device under test.

4. The test apparatus as set forth in claim 2, wherein
the pattern generating section inputs the test pattern to the device under test so as to measure the fluctuation of the source voltage, if a defective ratio of the device under test is determined by the judging section to be higher than a predetermined reference value after the actual testing of the device under test, and
the setting section sets the current range in the load fluctuation compensation circuit based on the fluctuation amount of the source voltage resulting when the test pattern is inputted to the device under test.

5. The test apparatus as set forth in claim 2, wherein
the pattern generating section repetitively inputs the test pattern to the device under test,
the setting section includes:
    a load control section that, each time the pattern generating section inputs the test pattern to the device under test, changes the current range in the load fluctuation compensation circuit so that the load fluctuation compensation circuit generate a compensation current that is in accordance with each resulting current range; and
    a measuring section that measures the fluctuation of the source voltage for each resulting current range, and
the load control section sets a current range at which the fluctuation amount of the source voltage measured by the measuring section becomes the minimum, to the load fluctuation compensation circuit at the actual testing of the device under test.

6. The test apparatus as set forth in claim 5, wherein the measuring section measures a source voltage waveform of the device under test for each test pattern inputted to the device under test, and detects the fluctuation amount of the source voltage for each test pattern by comparing the maximum value and the minimum value of the source voltage based on each measured source voltage waveform.

7. The test apparatus as set forth in claim 1, wherein the pattern generating section inputs, to the device under test, a predetermined test pattern that maximizes the fluctuation amount of the source voltage, and
the setting section detects the fluctuation of the source voltage resulting when the test pattern is inputted to the device under test, and sets the current range in the load fluctuation compensation circuit based on the detected fluctuation amount.

8. The test apparatus as set forth in claim 1, wherein the setting section includes a measuring section that measures the source voltage, and
the measuring section includes:
    an oscillator that outputs a clock signal having a frequency that is in accordance with the source voltage supplied to the device under test;
    a frequency measuring section that measures the frequency of the clock signal; and
    a voltage calculating section that calculates the source voltage based on the frequency measured by the frequency measuring section.

9. The test apparatus as set forth in claim 1, wherein the setting section includes:
    a load fluctuation compensation circuit that, so as to compensate a fluctuation of a source voltage to be applied to an internal circuit attributable to a fluctuation of a consumption current consumed by the internal circuit, generates a compensation current that is in accordance with the fluctuation of the consumption current within the set current range and at a predetermined number of levels.

10. A test method performed by a test apparatus for testing a device under test, the test method comprising:
    inputting a test pattern to the device under test;
    making judgment concerning pass/fail of the device under test, based on an output signal outputted from the device under test;
    supplying a source power to the device under test;
    detecting a fluctuation amount of the source voltage resulting when the test pattern is inputted to the device under test, and setting, based on the detected fluctuation amount, a current range within which a compensation current that is in accordance with a fluctuation of a consumption current consumed by the device under test can be generated, the current range having a predetermined number of levels that the compensation current can take; and
    generating, so as to compensate a fluctuation of a source voltage to be applied to the device under test attributable to the fluctuation of the consumption current consumed by the device under test, a compensation current that is in accordance with the fluctuation of the consumption current within the set current range and at a predetermined number of levels, wherein the generating step comprises:
        a first delaying step of delaying a supplied clock signal by a delay amount fluctuated by a predetermined first fluctuation amount with respect to a unit fluctuation amount of a source voltage supplied to the device under test;
        a second delaying step of, in parallel with the first delaying step, delaying a supplied clock signal by a delay amount fluctuated by a second fluctuation amount that is larger than the first fluctuation amount, with respect to the unit fluctuation amount of the source voltage supplied to the device under test;
        detecting a phase difference between the clock signal outputted from the first delay circuitry section and the clock signal outputted from the second delay circuitry section; and
        adjusting a consumption current amount consumed by a load circuit provided in parallel with the device under test and sharing at least part of power supply wiring with the device under test, within the set current range and at the number of levels based on the phase difference.

11. A non-transitory computer readable medium containing computer instructions stored therein for causing a computer processor to perform operations comprising:
    inputting a test pattern to a device under test;
    making judgment concerning pass/fail of the device under test, based on an output signal outputted from the device under test;
    supplying a source power to the device under test;
    detecting a fluctuation amount of the source voltage resulting when the test pattern is inputted to the device under test, and setting, based on the detected fluctuation amount, a current range within which a compensation current that is in accordance with a fluctuation of a consumption current consumed by the device under test can be generated, the current range having a predetermined number of levels that the compensation current can take; and
    generating, so as to compensate a fluctuation of a source voltage to be applied to the device under test attributable to the fluctuation of the consumption current consumed by the device under test, a compensation current that is in accordance with the fluctuation of the consumption current within the set current range and at a predetermined number of levels, wherein the generating step comprises:
        a first delaying step of delaying a supplied clock signal by a delay amount fluctuated by a predetermined first fluctuation amount with respect to a unit fluctuation amount of a source voltage supplied to the device under test;
        a second delaying step of, in parallel with the first delaying step, delaying a supplied clock signal by a delay amount fluctuated by a second fluctuation amount that is larger than the first fluctuation amount, with respect to the unit fluctuation amount of the source voltage supplied to the device under test;
        detecting a phase difference between the clock signal outputted from the first delay circuitry section and the clock signal outputted from the second delay circuitry section; and
        adjusting a consumption current amount consumed by a load circuit provided in parallel with the device under test and sharing at least part of power supply wiring with the device under test, within the set current range and at the number of levels based on the phase difference.

* * * * *